United States Patent [19]

Osakabe et al.

[11] Patent Number: 4,998,788
[45] Date of Patent: Mar. 12, 1991

[54] REFLECTION ELECTRON HOLOGRAPHY APPARATUS

[75] Inventors: Nobuyuki Osakabe, Kodaira; Akira Tonomura, Koganei, both of Japan

[73] Assignee: Hitachi, Ltd., Tokyo, Japan

[21] Appl. No.: 462,769

[22] Filed: Jan. 10, 1990

[30] Foreign Application Priority Data

Jan. 13, 1989 [JP] Japan .................................... 1-4999

[51] Int. Cl.$^5$ ............................................. G03H 5/00
[52] U.S. Cl. .................................... 350/3.8; 350/3.6; 250/306; 250/311
[58] Field of Search ................. 350/3.6, 3.67, 3.8; 250/306, 307, 311

[56] References Cited

U.S. PATENT DOCUMENTS

| | | | |
|---|---|---|---|
| 2,492,738 | 12/1949 | Gabor | 350/3.6 |
| 4,532,422 | 7/1985 | Fukuzawa et al. | 250/492.3 |
| 4,748,132 | 5/1988 | Fukuzawa et al | 250/492.3 |

OTHER PUBLICATIONS

Optic Suppl. 377 (1987), p. 4.
Jpn. J. Appl. Phys. vol. 27, No. 9, (1988/9), pp. L1772-L1774.

*Primary Examiner*—Bruce Y. Arnold
*Assistant Examiner*—J. P. Ryan
*Attorney, Agent, or Firm*—Antonelli, Terry, Stout & Kraus

[57] ABSTRACT

An apparatus forming a reflection electron hologram, wherein a fraction of an electron wave from an electron source illuminate a specimen and caused to be reflected thereat, the remaining electron wave does not illuminate the specimen, but passes aside, the specimen, and the electron wave reflected from the specimen and the electron wave not illuminating, but passes aside, the specimen, are superimposed one upon the other.

8 Claims, 3 Drawing Sheets

REFLECTION ELECTRON HOLOGRAPHY APPARATUS

BACKGROUND OF THE INVENTION

This invention relates generally to a surface measurement apparatus, and more particularly to a reflection electron holography apparatus suitable for the precise measurement of undulation of the surface of a solid specimen and for the measurement of magnetic field perpendicular to a specimen.

According to the prior art, as described for example in Optic Suppl. 3 77 (1987) page 4 and Jpn. J. Appl. Phys. vol. 27 No. 9 (1988/9) pp. L1772-L1774, electron waves reflected from a specimen are caused to interfere with each other in an electron microscope to obtain about ten interference fringes whose shifts are measured to determine the height of a surface step. The phases of reflected waves are modulated by undulation on the surface of a specimen. In the prior art, the interference pattern is produced between object waves (reflected waves from a specimen) and therefore difficult for the analysis thereof, which is quite different from that of an usual interference micrograph where a reference plane wave interferes with an object wave modulated by a specimen. If a reflected wave were made to interfere with a direct wave (a wave not illuminating a specimen), the interval between interference fringes would become narrower than the resolution limit of a presently available electron holography apparatus, necessarily leading to an electron hologram generated by interference between reflected waves as in the prior art.

SUMMARY OF THE INVENTION

It is an object of the present invention to provide a reflection electron holography apparatus having an electron optical system capable of superimposing a reflected wave upon a direct wave within a coherence length of an electron wave and forming a reflection electron hologram having a recordable fringe interval.

The above object of the present invention can be achieved in the following manner. Namely, in an electron microscope, the relative position at the image plane between a reflection image of a specimen and an image of an electron wave not illuminating the specimen changes with the focal point of the electron lens. An electron biprism is provided between the specimen and an image recording device so that when both the images are superimposed one upon the other, a specific defocus value and a specific electron biprism potential are set so as to make the reflected wave and direct wave superimpose one upon the other within the coherence length of the electron wave and provide a recordable fringe interval. The above object can be achieved therefore by controlling the defocus value and electron biprism potential so as to give an appropriate fringe interval.

Further, by providing a plurality of electron biprisms, it becomes possible to change the intersecting angle between, and also change overlapping region of, the reflected wave and direct wave, independently from each other. It becomes possible therefore to form a hologram having a fringe interval within the resolution limit.

Specifically, with the defocus value $\Delta f$ of an objective lens, the distance $d$ at the specimen position between the reflection image and direct wave image is given by:

$$d = Cs\alpha^3 - \Delta f \alpha \qquad (1)$$

where $Cs$ is the spherical aberration coefficient of the objective lens, and $\alpha$ is the angle between the reflected wave and direct wave. As seen from the equation (1), the positional relation between two images is reversed (the sign of a distance value between two images is reversed) when the defocus value becomes larger or smaller than $Cs\alpha^2$. When two images are superimposed one upon the other by using the electron biprism provided between the image plane and specimen, the intersecting angle becomes smaller than the angle between the reflected wave and direct wave at the one positional relation, and becomes larger at the other positional relation. Consequently, a hologram through interference between the reflected wave and direct wave can be obtained by properly controlling the focal distance and electron biprism potential so as to make the intersecting angle small enough to give a recordable fringe interval. A reflection electron hologram can be obtained by using an apparatus which can read and control the focal distance of the objective lens and the electron biprism potential so as to give an appropriate fringe interval.

DESCRIPTION OF THE PREFERRED EMBODIMENTS

The embodiments of the present invention will be described with reference to the accompanying drawings.

Figure 1:
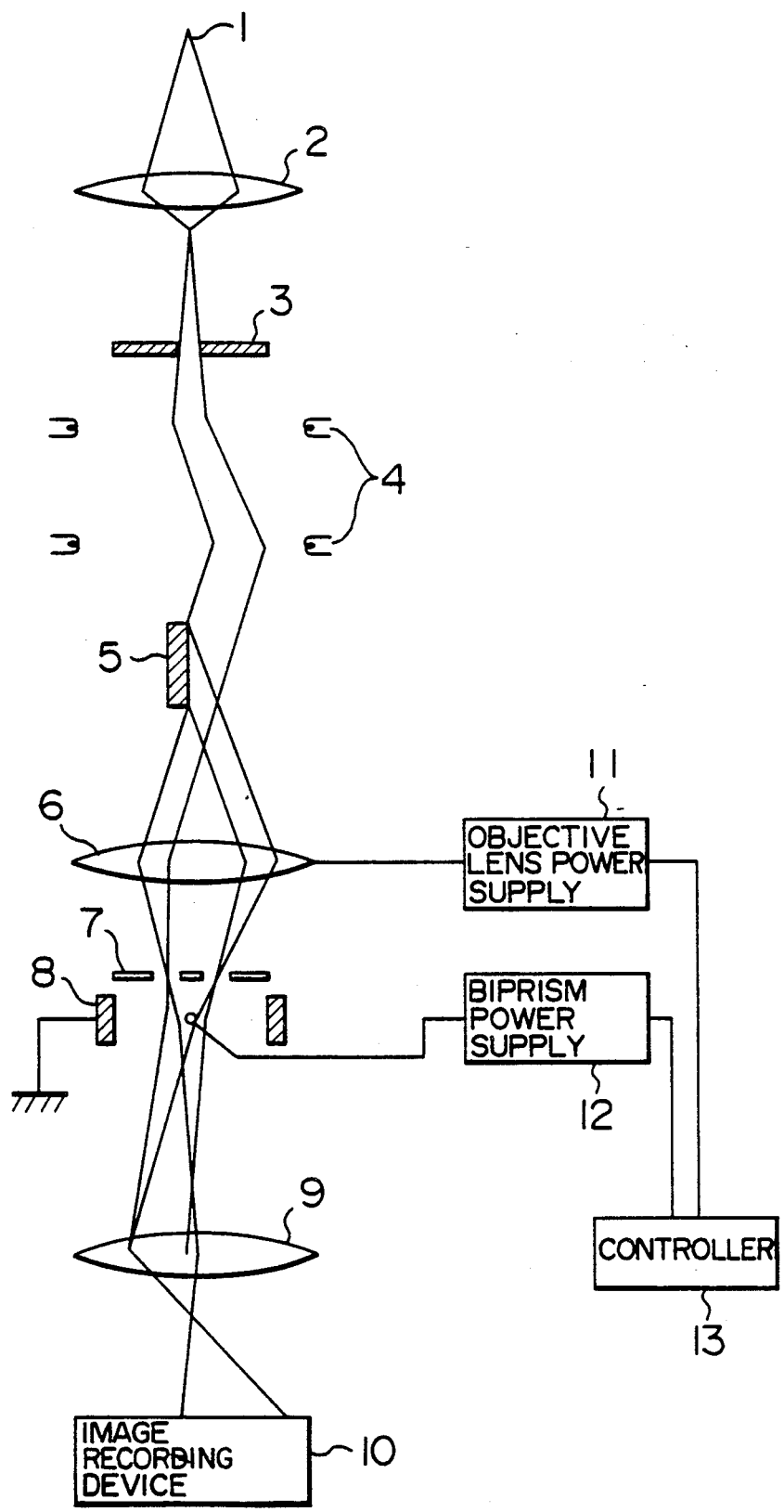
FIG. 1 is a sectional view of an electron optical system according to a first embodiment of this invention.

Referring to FIG. 1 showing the first embodiment of this invention, electrons emitted from an electron source 1 are first converged by a condenser lens 2, and passes through an aperture 3 to be formed into a collimated electron wave. The electron wave is directed to a specimen 5 by means of a deflector 4, at an angle, e.g., at the Bragg angle causing a total reflection of the wave. The position of the specimen 5 and the position of the electron wave are so adjusted that a half of the electron wave does not illuminate the specimen. The reflected wave and direct wave are focussed by an objective lens 6. The reflected wave and direct wave are passed through an aperture 7 mounted at the back focal plane of the lens, while other inelastic scattering electrons and the like are intercepted to improve an S/N ratio. An electron biprism is mounted downstream of the aperture, the electron biprism being constructed of a central wire and opposing ground electrodes. The objective lens 6 is over-focused by an amount of $\Delta f$ so that $\Delta f \cdot \alpha$ is larger than $Cs\alpha^3$. The central wire of the electron biprism 8 is supplied with a negative potential to diverge the reflected wave and direct wave respectively passing through the opposite sides of the central wire. With this arrangement, the reflected wave and direct wave are superimposed one upon the other at the image plane, while making the intersection angle smaller than the angle between the reflected wave and direct wave at the specimen position. The objective lens 6 is driven by an objective lens power supply 11, and the electron biprism 8 by a biprism power supply 12. With the necessary interference region being inputted to a controller 13, the objective lens power supply 11 and biprism power supply 12 are worked so as to form a reflection electron hologram having desired interference region and fringe interval. This hologram is enlarged by a magnifying lens 9 and recorded with an image recording device 10. The recording device may use a combination of a photographic dry plate, photographic film, fluorescent screen, image intensifier, television camera, etc.

Since this embodiment uses a single stage of an electron biprism, it is advantageous in that the apparatus does not require angle adjustment of biprism wire directions or the like so that it is easy to use.

Figure 2:
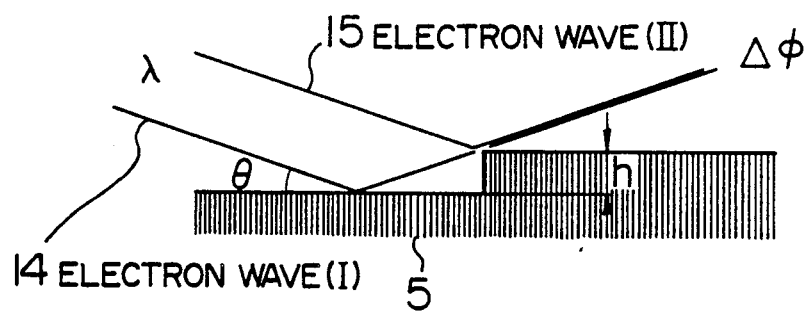
FIG. 2 is a diagram illustrating a change in phase of an electron wave caused by a step on the surface of a specimen.

FIG. 2 illustrates how much the phase changes in accordance with undulation on the surface of a specimen. A specimen 5 is assumed as having a surface step of height h. An electron wave (I) 14 is reflected by the lower terrace, and an electron wave (II) 15 by the upper terrace. In this case, the phase difference $\Delta\phi$ between two electron waves is simply obtained on the basis of a geometrical path difference therebetween, and given by the following equation:

$$\Delta\phi = 2h \sin\theta\lambda \qquad (2)$$

where $\lambda$ is the wavelength of an electron wave, $\theta$ is the glancing angle of an electron wave. Assuming that there is used an electron wave accelerated with 100 kV, the phase changes by about $\frac{1}{3}$ of a wavelength if the step h is 0.1 Å. The measurement precision now available is about 1/100 of a wavelength. It is therefore possible to transform an electron hologram into an image indicating the height distribution of a specimen surface, either by optically reproducing it directly from the hologram or by inputting the hologram data into a computer and processing the data.

Figure 3:
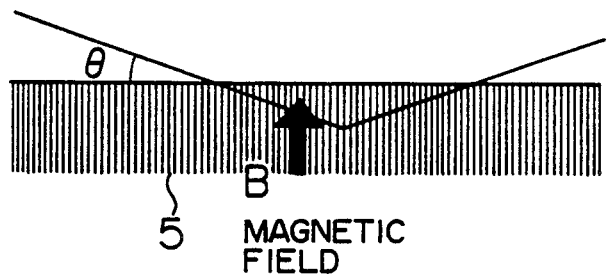
FIG. 3 is a diagram illustrating a change in phase caused by magnetic field perpendicular to the surface of a specimen.

FIG. 3 illustrates a phase change when there is a magnetic field B perpendicular to a specimen. A perpendicular magnetic field can not be detected by conventional transmission holography, because a magnetic field parallel to the propagation direction of an electron wave does not influence the phase of the electron wave. In the case of reflection, an electron wave can be made incident to a specimen substantially in parallel to the specimen surface, so that the perpendicular magnetic field and the propagation direction of an electron wave can be made substantially perpendicular relative to each other. The magnetic field B is expressed by a vector potential A in the form of:

$$B = \text{rot } A \qquad (3)$$

the phase difference $\Delta\phi$ is then given by:

$$\Delta\phi = \int A \cdot ds \qquad (4)$$

where ds is a line element taken along a path of an electron wave.

Figure 4:
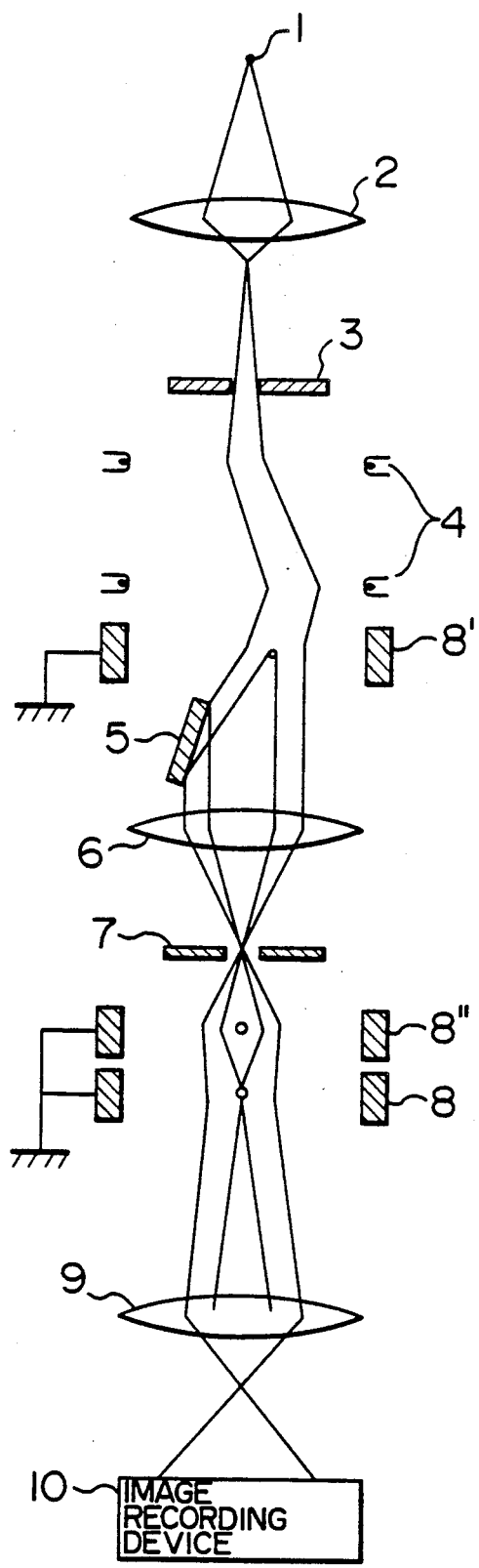
FIG. 4 is a sectional view of an electron optical system according to a second embodiment of this invention.

FIG. 4 shows the second embodiment. Electrons emitted from an electron source 1 are first converged by a condenser lens 2, and passed through an aperture 3 to be formed into a collimated electron wave. The electron wave is deflected by a deflector 4 and split into two electron waves by a first electron biprism 8'. By setting the angle between two split electron waves equal to the sum of the reflection angle and incident angle at a specimen, the reflected wave and direct wave incident to an objective lens 6 can be made approximately parallel. Only the reflected wave and direct wave focussed by the objective lens 6 are allowed to pass through an aperture 7 mounted at the back focal plane of the objective lens 6. Since the two waves are incident to the objective lens in parallel, it is sufficient for the aperture 7 to have only one hole, resulting in an easy manufacture thereof. Second and third electron biprisms 8" and 8 are provided for superimposing the reflected wave and direct wave one upon the other. The use of the two stages of electron biprisms allows independent control of the intersecting angle and overlapping region. This superimposed image, i.e., reflection electron hologram, is enlarged by a magnifying lens 9 to the extent that it can be recorded with an image recording device 10 having a particular resolution.

As compared with the first embodiment, the direct wave of the second embodiment is split upstream of a specimen. The second embodiment can therefore be used effectively for the case where a specimen is too large so that it is difficult to obtain the direct wave by using the first embodiment. It is also advantageous in that the objective aperture 7 requires only one hole. The first embodiment requires two holes the distance between which varies with a diffraction condition. It is therefore necessary to prepare apertures having various hole distances to use a suitable one for a particular condition.

Also in the second embodiment, through the control of the three electron biprisms 8, 8' and 8" in association with the objective lens, the equipment is given a good operability.

As seen from the foregoing detailed description of this invention, undulation on the surface of a specimen can be measured with a precision better than 0.1 Å by using reflection electron holography. It is also possible to measure a magnetic field perpendicular to the surface of a specimen which cannot be measured by conventional transmission electron holography methods. Further, although transmission electron holography is limited in application only to thin film specimens, this invention also allows bulk specimens to be measured so that the application field is broadened.

What is claimed is:

1. A reflection electron holography apparatus comprising:

an electron source for emitting an electron wave;
   means for guiding the electron wave emitted from the electron source so that one part of the electron wave illuminates a surface of a specimen and is reflected along a first predetermined path and another part of the electron wave is directly passed along a second predetermined path without illuminating the surface of the specimen; and
   means for controlling both the first and second predetermined paths of the one and another parts of the electron wave so as to effect an electron wave interference image of the one and another parts of the electron wave on a screen.

2. A reflection electron holography apparatus according to claim 1, wherein the means for guiding the electron wave comprises:

a condenser lens for converging the electron wave emitted from the electron source;

a plate having an aperture for enabling the converged electron wave to pass therethrough; and a deflector for regulating the direction of the electron wave passed through the aperture of the plate in order to guide the one and another parts of the electron wave.

3. A reflection electron holography apparatus according to claim 1, wherein the means for controlling both the first and second predetermined paths comprises:

an objective lens for focusing the one part of the electron wave reflected from the surface of the specimen along the first predetermined path and the another part of the electron wave directly passed along the second predetermined path;

a plate having an aperture for passing therethrough the one and another parts of the electron wave focused by the objective lens; and at least one biprism for controlling both the first and second predetermined paths of the one and another parts of the electron waves passed through the plate so as to effect an electron wave interference image on the screen.

4. A reflection electron holography apparatus according to claim 3, wherein the plate has a single aperture for passing therethrough the focused one and another parts of the electron wave.

5. A reflection electron holography apparatus according to claim 4, wherein the at least one biprism includes two biprisms arranged in cascade along the first and second predetermined paths of the one and another parts of the electron wave.

6. A reflection electron holography apparatus according to claim 1, wherein the means for guiding the electron wave comprises:

a condenser lens for converging the electron wave;

a plate having an aperture for passing the converged electron wave therethrough;

a deflector for regulating the direction of the electron wave passed through the aperture of the plate; and a biprism for separating the electron wave so as to form the one part of the electron wave for illuminating the surface of the specimen and reflection therefrom along a first predetermined path and the another part of the electron wave for directly passing along the second predetermined path.

7. A reflection electron holography apparatus comprising:

an electron source for emitting an electron wave;

a condenser lens for converging the electron wave;

a plate having an aperture for passing the converged electron wave therethrough;

a deflector for regulating the direction of the electron wave passed through the aperture for enabling guidance of one part of the electron wave so as to illuminate a surface of a specimen and be reflected therefrom and another part of the electron wave so as to directly pass along a predetermined path without illuminating the surface of the specimen;

an objective lens for focusing both of the one and another parts of the electron wave;

a plate having an aperture for passing therethrough the one and another parts of the electron wave focused by the objective lens; and a biprism for controlling paths of the one and another parts of the electron wave passed through the plate so as to effect an electron wave interference image of the one and another parts of the electron wave on a screen.

8. A reflection electron holography apparatus comprising:

an electron source for emitting an electron wave;

a condenser lens for converging the electron wave;

a plate having an aperture for passing the converged electron wave therethrough;

a deflector for regulating the direction of the electron wave passed through the plate;

a biprism for separating the electron wave so as to form one part of the electron wave to illuminate a surface of a specimen and be reflected therefrom and another part of the electron wave to directly pass along a predetermined path without illuminating the surface of the specimen;

an objective lens for focusing both of the one part of the electron wave reflected from the surface of the specimen and the another part of the electron wave directly passed along the predetermined path;

a plate having a single aperture for passing therethrough both of the focused one and another parts of the electron wave; and two biprisms arranged in cascade for controlling paths of the one and another parts of the electron wave passed through the plate so as to effect an electron wave interference image on a screen of the one and another parts of the electron wave.

* * * * *